United States Patent [19]

Webb

[11] Patent Number: 4,903,401
[45] Date of Patent: Feb. 27, 1990

[54] LEADFRAME SILVER BLEED ELIMINATION

[75] Inventor: Brian A. Webb, Mesa, Ariz.

[73] Assignee: Motorola, Inc., Schaumburg, Ill.

[21] Appl. No.: 331,972

[22] Filed: Apr. 3, 1989

[51] Int. Cl.$^4$ .......................................... H01R 43/00
[52] U.S. Cl. ................................. 29/827; 174/52.4; 204/15; 357/69; 357/70
[58] Field of Search ................. 29/827; 357/70, 69; 174/52.4; 437/206; 204/15

[56] References Cited

FOREIGN PATENT DOCUMENTS

| | | | |
|---|---|---|---|
| 52-2171 | 1/1977 | Japan | 357/70 |
| 58-188147 | 11/1983 | Japan | 29/827 |
| 60-177663 | 9/1985 | Japan | 357/70 |
| 60-208849 | 10/1985 | Japan | 357/70 |
| 63-104457 | 5/1988 | Japan | 357/70 |

Primary Examiner—Carl J. Arbes
Attorney, Agent, or Firm—Joe E. Barbee

[57] ABSTRACT

A method of making a leadframe useful in packaging semiconductor devices eliminates silver bleed between adjacent leads of the leadframe. This is accomplished by leaving excess leadframe material along the edges of the leads prior to silver plating the flag area and the portion of the leads adjacent to the flag area. After the plating operation, this excess leadframe material is removed thereby leaving silver free leads which will be exposed outside of a resulting encapsulated semiconductor package.

4 Claims, 2 Drawing Sheets

LEADFRAME SILVER BLEED ELIMINATION

BACKGROUND OF THE INVENTION

This invention relates, in general, to leadframes used in manufacturing semiconductor devices, and more particularly, to a method of manufacturing leadframes to eliminate silver bleed on the leads themselves.

Leadframes are typically made from a flat sheet of leadframe material. The leadframes are either stamped, punched, or etched from the sheet of material. A portion of the leadframes is normally silver plated to be compatible with semiconductor die attach and wire bond systems. The portion of the leadframe that needs to be plated is a flag area and the portion of the leads themselves which is adjacent to the flag area. It is this portion of the lead which is wire bonded. Wire bonding consists of bonding a wire between each individual lead of a semiconductor die which is located on the flag area.

Once the leadframe is formed, the plating operation is performed, and then the flag area of the leadframe is down set and the leadframes are cut into desired groups. The group may consist of any desirable number of individual leadframes desired such as six or eight, or the like. The down set operation lowers the flag area so that once the semiconductor die is bonded to the flag area it will be at the same height or elevation as the leads themselves.

During the silver plating operation a mask is placed on the top and the bottom of the leadframe in an attempt to avoid plating portions of the leadframe which are not to be plated. However, during plating silver will bleed along the edges between the leads underneath the masking clamp. After the encapsulation the silver that bleeds along the edges of the leads can then form silver dendrites or silver migration between the leads themselves when a voltage potential is applied between the leads or when the leads are exposed to a humid environment. This will cause an electrical short between the leads resulting in an electrical failure. In an attempt to remove the silver bleed between the leads the encapsulated leadframes are placed in a descaling solution or etchant to remove the silver bleed. Sometimes this results in undercutting the silver thereby creating silver slivers. Therefore it should be appreciated that it would be desirable to provide a method of manufacturing leadframes which totally eliminates silver bleed.

Accordingly, it is an object of the present invention to provide a method of eliminating leadframe silver bleed.

Another object of the present invention is to provide a method of eliminating leadframe silver bleed which does not involve a chemical process.

Yet another object of the present invention is to provide a cost effective method to eliminate silver bleed between the leads of the leadframe.

SUMMARY OF THE INVENTION

The above and other objects and advantages of the present invention are achieved by leaving some of the leadframe material along the edges of the leads near the dam bar before the leadframe is plated. After the silver plating is performed, the excess material is removed. The excess material is left near the dam bar on the side of the dam bar nearest the flag area. In one embodiment, the material is left just along the edges of the leadframe, and in another embodiment the material is left in a manner to enclose the area between the leads adjacent to the dam bar. Once the excess material is removed, the leads are totally free of any silver bleed.

DETAILED DESCRIPTION OF THE DRAWINGS

Figure 1:
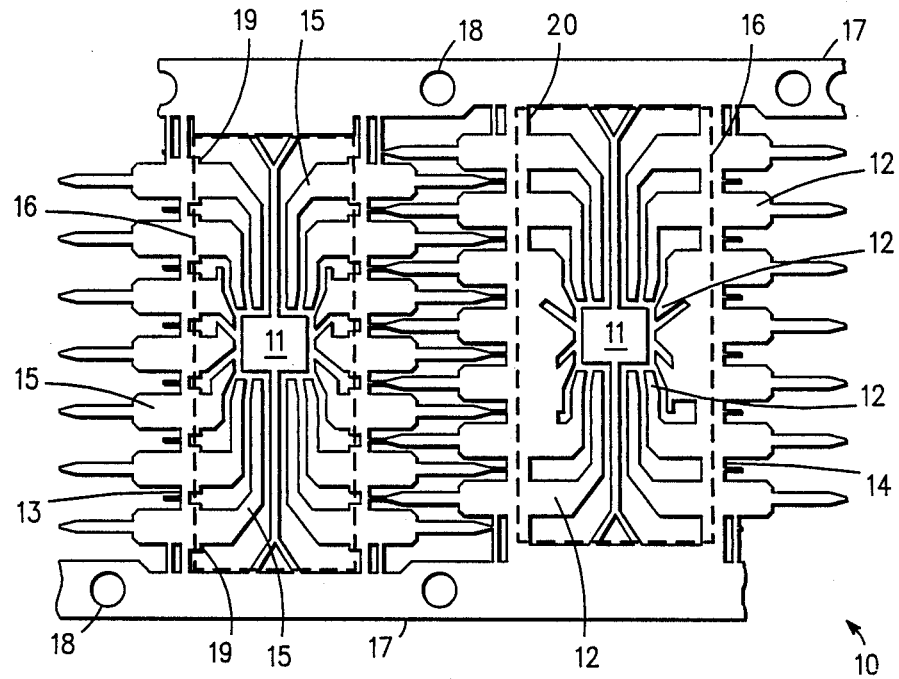
FIG. 1 shows a portion of a leadframe using the present invention.

FIG. 1 illustrates a leadframe assembly having two individual leadframes. The leadframe on the left illustrates one embodiment of the invention, while the leadframe on the right illustrates another embodiment of the present invention. The two leadframes are held together by side rails 17. Side rails 17 have indexing holes 18 which are used to move or index the leadframe during assembly of the leadframe with a semiconductor device. The semiconductor device is placed on a flag area 11. Each flag area 11 has a plurality of leads 15 or 12 adjacent to flag area 11. These leads 15, 12 extend from adjacent flag area 11 and will form the interface pins for the circuit. The leadframes illustrated are for a 14 pin dual in line package (DIP). In other words, each flag area 11 has 14 pins 15 or 12 associated with it. Leads 15 are interconnected by a dam bar 13. Leads 12 are interconnected by a dam bar 14. The difference between dam bar 13 and dam bar 14 is that dam bar 14 is much wider than dam bar 13. The additional width occurs inside an area designated by dotted line 16. Dotted line 16 indicates an outline for the resulting dual in line package. As those skilled in the art will recognize, a DIP package is a plastic encapsulated semiconductor package containing a semiconductor device which will be placed on flag area 11 and connected to its associated leads by bonding wires.

Additional leadframe material 20 gives dam bar 14 its increased width. The portion of leads 12 which are contained within dotted area 16, as well as flag area 11, are silver plated in order to render them more compatible with the semiconductor die attachment to flag area 11 and with the wire bonding of interconnections from the semiconductor die to leads 12. Once flag area 11 and its associated leads 12 adjacent to flag area 11 are silver plated, leadframe 10 then goes through a down set operation which lowers flag 11 so that when a semiconductor die is mounted on flag area 11 it will be at the same elevation with leads 12. During the down set operation excess material 20 is removed, thereby leaving the sides of the portion of leads 12 between dotted line 16 and dam bar 14 free of silver.

Another embodiment of the present invention is illustrated by leads 15 which have excess material 19 along the edges of leads 15 near dam bar 13. The excess material extends towards the inside of the area designated by dotted line 16. Excess material 19 serves the same purpose as excess material 20; however, excess material 19 only exists along the edges of leads 15. After silver plating, excess material 19 is removed to leave the sides or edges of leads 15 outside of dotted line 16 free of silver.

Figure 2:
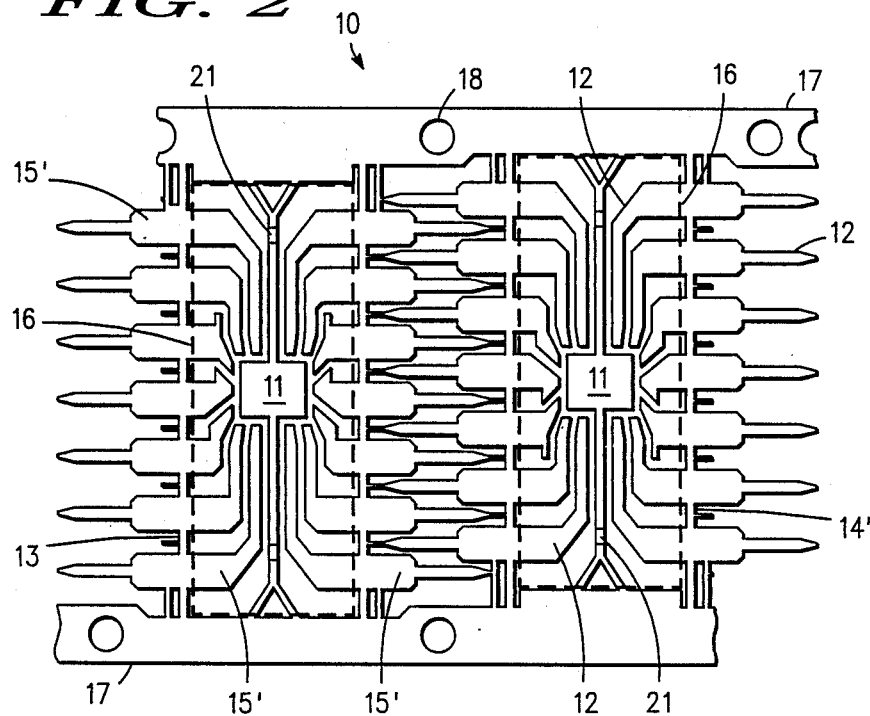
FIG. 2 illustrates the leadframe of FIG. 1 following an additional manufacturing step.

FIG. 2 illustrates leadframe 10 after excess material 19 and excess material 20 has been removed. Also flag areas 19 have been down set as indicated by bends 21. Once excess material 20 is removed, dam bar 14' is now the same width as dam bar 13. In addition, note that leads 15' now have the same configuration as leads 12.

Thus the present invention eliminates any silver from the silver plating operation from bleeding between the leads outside of the package outline indicated by dotted line 16. During the plating operation, a masking clamp such as a rubberized clamp is placed on the top and bottom of leadframe 10 while flag area 11 and the portion of leads 12 or 15 adjacent to flag area 11 are silver plated. If the silver plating bleeds underneath the clamping mask between the leads outside of dotted lines 16 a voltage potential or humidity can cause the silver to migrate and thereby cause an electrical short between the adjacent leads. After a semiconductor die is attached to flag area 11 and wire bonded to the adjacent leads, side rails 17 are removed as well as portions of the dam bar located between the leads.

Figure 3:
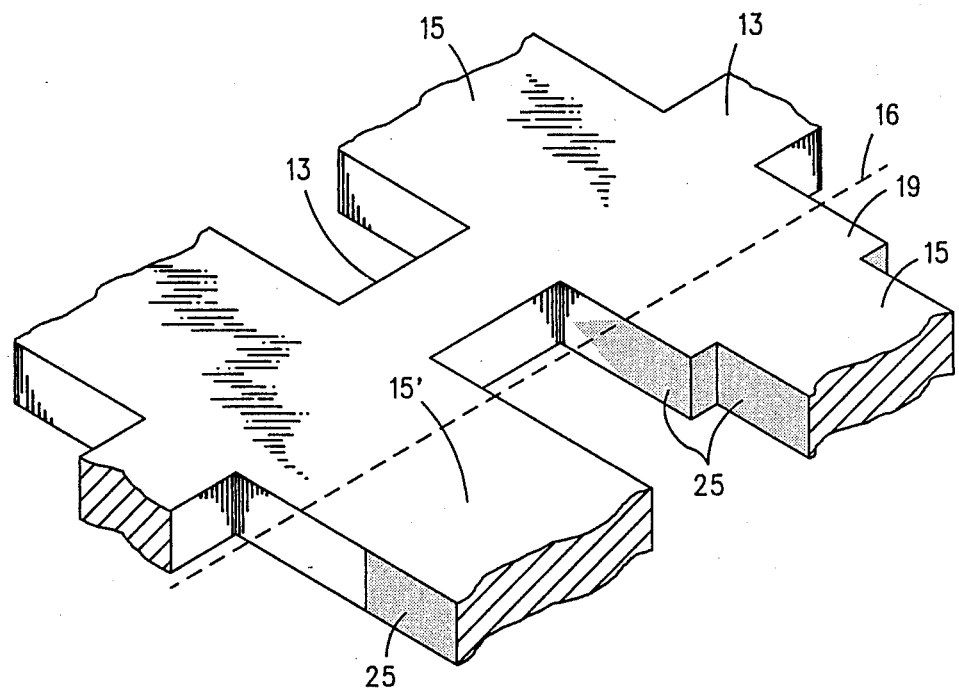
FIG. 3 is an enlarged view of a portion of the leadframe of FIG. 1 which illustrates the present invention in greater detail.

FIG. 3 is an enlarged view of a portion of a leadframe to illustrate two adjacent leads in a before and after configuration for a better understanding of the present invention. Only two leads 15 and 15' are shown connected by dam bar 13. Lead 15 shows excess material 19 and lead 15' is illustrated after excess material 19 has been removed. Also illustrated is silver plating 25. As can be seen, silver plating 25 exceeds the boundaries of dotted line 16 along the edges of lead 15. However, once excess material 19 is removed silver plating bleed is eliminated from the side edges of the leads outside of dotted line 16. This provides leads outside of a resulting plastic encapsulated package, indicated by dotted line or enclosure 16, that are free of any silver plating. Although not apparent from FIG. 3, the silver plating is on the top side and bottom side of the portion of leads 15, 15' that is inside of dotted enclosure 16

I claim:

1. A method to eliminate silver bleed on a leadframe having a flag area, a plurality of leads extending from adjacent the flag area, and a dam bar tieing the leads together a predetermined distance from the flat area, comprising the following steps: providing material to form the leadframe; forming the leadframe including leaving leadframe material along edges of the leads adjacent the dam bar on the flag area side of the dam bar to receive any silver bleed; plating the leads between the dam bar and the flag area with silver; and removing the leadframe material left along edges of the leads.

2. The method of claim 1 further comprising cutting the plurality of leads to predetermined lengths after the plating step.

3. The method of claim 1 wherein the material left along edges of the leads extends between adjacent leads.

4. A method to eliminate plating material bleed in a leadframe assembly useful in packaging semiconductor devices and having a plurality of flag areas and a plurality of leads associated with each flat area, a dam bar made from leadframe material interconnects the plurality of leads and is located a short distance from the flag area, comprising the following method: providing material to form the leadframe; forming the leadframe including leaving leadframe material along edges of the leads adjacent to and in contact with the dam bar toward the flag area; selectively plating the leadframe including the material left along the edges of the leads; and removing the material left along the edges of the leads thereby providing a leadframe void of plating material along the edges of the leads near the dam bar to eliminate bleeding between the leads.

* * * * *

UNITED STATES PATENT AND TRADEMARK OFFICE
CERTIFICATE OF CORRECTION

PATENT NO. : 4,903,401

DATED : February 27, 1990

INVENTOR(S) : Brian A. Webb

It is certified that error appears in the above-identified patent and that said Letters Patent is hereby corrected as shown below:

Column 4, claim 1, line 7, change "flat" to --flag--.

Column 4, claim 4, line 23, change "flat" to --flag--.

Signed and Sealed this

Third Day of March, 1992

*Attest:*

HARRY F. MANBECK, JR.

*Attesting Officer*     *Commissioner of Patents and Trademarks*